United States Patent
Chen et al.

(10) Patent No.: US 8,384,201 B2
(45) Date of Patent: Feb. 26, 2013

(54) WAFER AND METHOD FOR IMPROVING YIELD RATE OF WAFER

(75) Inventors: Ting-Sheng Chen, Hsinchu (TW); Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 786 days.

(21) Appl. No.: 12/566,632

(22) Filed: Sep. 24, 2009

(65) Prior Publication Data

US 2010/0320565 A1    Dec. 23, 2010

(30) Foreign Application Priority Data

Jun. 18, 2009 (TW) ............................... 98120486 A

(51) Int. Cl.
*H01L 23/02* (2006.01)
(52) U.S. Cl. ......... 257/686; 257/698; 257/777; 257/786
(58) Field of Classification Search .................. 257/686, 257/698, 777, 786
See application file for complete search history.

(56) References Cited

U.S. PATENT DOCUMENTS

| 5,962,910 | A | 10/1999 | Hawley et al. |
| 7,355,273 | B2 | 4/2008 | Jackson et al. |
| 2002/0137255 | A1 | 9/2002 | Wang et al. |
| 2010/0060310 | A1* | 3/2010 | Laisne et al. ................. 326/10 |

FOREIGN PATENT DOCUMENTS

| TW | I254425 | 5/2006 |
| TW | I299901 | 8/2008 |

OTHER PUBLICATIONS

Authored by Knickerbocker, et al., article titled "Three-dimensional silicon integration," adopted from 2008 Electronic components and Technology Conference, pp. 538-543.
"Office Action of Taiwan Counterpart Application", issued on Aug. 24, 2012, p. 1-p. 5, in which the listed references were cited.

* cited by examiner

*Primary Examiner* — Samuel Gebremariam
(74) *Attorney, Agent, or Firm* — Jianq Chyun IP Office

(57) ABSTRACT

A wafer and a method for improving the yield rate of the wafer are provided. The wafer includes a first and a second circuit units, a first and a second through silicon vias (TSVs), and a first spare TSV. The first and the second circuit units are disposed inside the wafer. The first TSV vertically runs through the wafer and is coupled to the first circuit unit through the front metal of the wafer. The second TSV vertically passes through the wafer and is coupled to the second circuit unit through the front metal of the wafer. When the first or the second TSV has failed, the first spare TSV vertically passes through the wafer to replace the failed first or second TSV.

18 Claims, 9 Drawing Sheets

WAFER AND METHOD FOR IMPROVING YIELD RATE OF WAFER

CROSS-REFERENCE TO RELATED APPLICATION

This application claims the priority benefit of Taiwan application serial no. 98120486, filed on Jun. 18, 2009. The entirety of the above-mentioned patent application is hereby incorporated by reference herein and made a part of specification.

BACKGROUND OF THE INVENTION

1. Technical Field

The present invention relates to a wafer, and more particularly to a wafer having a common spare through silicon via (TSV) and a method of improving a yield rate thereof.

2. Background

In a through silicon via (TSV) technique, a hole is first drilled on a wafer by etching or laser, then a conductive material is filled into the hole to connect a circuit. Next, the wafer or a die is thinned for stacking and bonding. The TSV technique is adopted as a stacking technique for signal transmission between wafers.

FIG. 1 is a schematic diagram illustrating a TSV of a conventional wafer. Referring to FIG. 1, in a cross-sectional view, a circuit unit 101 inside a wafer 100 is coupled to a TSV 102 and a pad 105 via a front metal FM of the wafer 100. Moreover, the circuit unit 101 is also coupled to a pad 104 via the front metal FM of the wafer 100, the TSV 102, and a back metal BM of the wafer 100. The circuit unit 101 is capable of transmitting signals with circuit units (not shown) inside wafers of upper and lower layers via the TSV 102 and the pads 104 and 105. Therefore, a die stack is achieved using the TSV technique.

However, the die stack using the TSV technique for three-dimensional integration has a higher throughput in a wafer-to-wafer process than other processes in a bonding method. A yield of the die stack not only depends on a quality of the wafer itself, but is also closely related to the TSV technique. Although the yield product of the die stack can be enhanced by operating various techniques, such as improving system defects or selecting known good dies (KGDs) with smaller location differences, the last obstacle still regards to the yield of the TSV technique.

Comparing to through holes connecting every metal layer inside the wafer, the TSV needs to penetrate a substrate of the wafer, thus has a deeper depth and a higher failure rate.

In addition, a function of the TSV is generally categorized into four types: signal transmission, power delivery, thermal conduction, and input/output port connection. Inherent design demands of the latter three types include an application of a plurality of (more than one) bonds or a preference of adopting a TSV with a greater diameter, thus have small effects on the yield and reliability. However, the TSV for signal transmission does not have the same design demands. The TSV for signal transmission have higher interconnection density, so the yield of the die stack is easily affected by the yield thereof. Hence, the yield needs to be improved by laying out spare TSVs.

It should be noted that the diameter of the TSV ranges from few micrometers to tens of micrometers. Comparing to the semiconductor process technique with a nanometer scale, the diameter of the TSV is obviously much greater. Since failures happen randomly, it is necessary for every normal TSV to have a spare. As a result, the yield is increased and the reliability is enhanced, but an area of the wafer is increased as well. Nevertheless, in the numerous TSVs, only a few would fail and require repairment. When the spare TSVs are not being used, they are redundancies that occupy the wafer area. If only a portion of the TSVs are provided with the spare TSVs, an overall yield is still affected by the failure rate of a portion of the TSVs not provided with the spare TSVs.

FIG. 2 is a schematic diagram illustrating a TSV of another conventional wafer with a spare TSV 203. Referring to FIG. 2, a wafer 200 applies a one-to-one sparing manner, so that the spare TSV 203 is added beside each normal TSV 202. A circuit unit 201 is coupled to the TSV 202 and the spare TSV 203 via a front metal FM of the wafer 200. Besides, the circuit unit 201 is also coupled to a back metal BM of the wafer 200 via the front metal FM of the wafer 200, the TSV 202, and the spare TSV 203.

SUMMARY

According to the present exemplary embodiment, a wafer including a first and a second circuit units, a first and a second through silicon vias (TSVs), and a first spare TSV is provided. The first circuit unit and the second circuit unit are both disposed inside the wafer. The first TSV passes through the wafer and is coupled to the first circuit unit via a front metal of the wafer. The second TSV passes through the wafer and is coupled to the second circuit unit via the front metal of the wafer. When the first or second TSV has failed, the first spare TSV passes through the wafer to replace the failed first or second TSV.

According to another embodiment, a method of improving a yield rate of a wafer is provided. Here, the inside of the wafer includes a first and a second circuit units. The method includes the following: a first TSV is provided to pass through the wafer and the first TSV is coupled to the first circuit unit via a front metal of the wafer; a second TSV is provided to pass through the wafer, where the second TSV is coupled to the second circuit unit via the front metal of the wafer; a first spare TSV is provided to pass through the wafer; and when the first or the second TSV has failed, the first spare TSV is adopted to replace the failed TSV.

It is to be understood that both the foregoing general description and the following detailed description are exemplary, and are not intended to limit the scope of the present invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
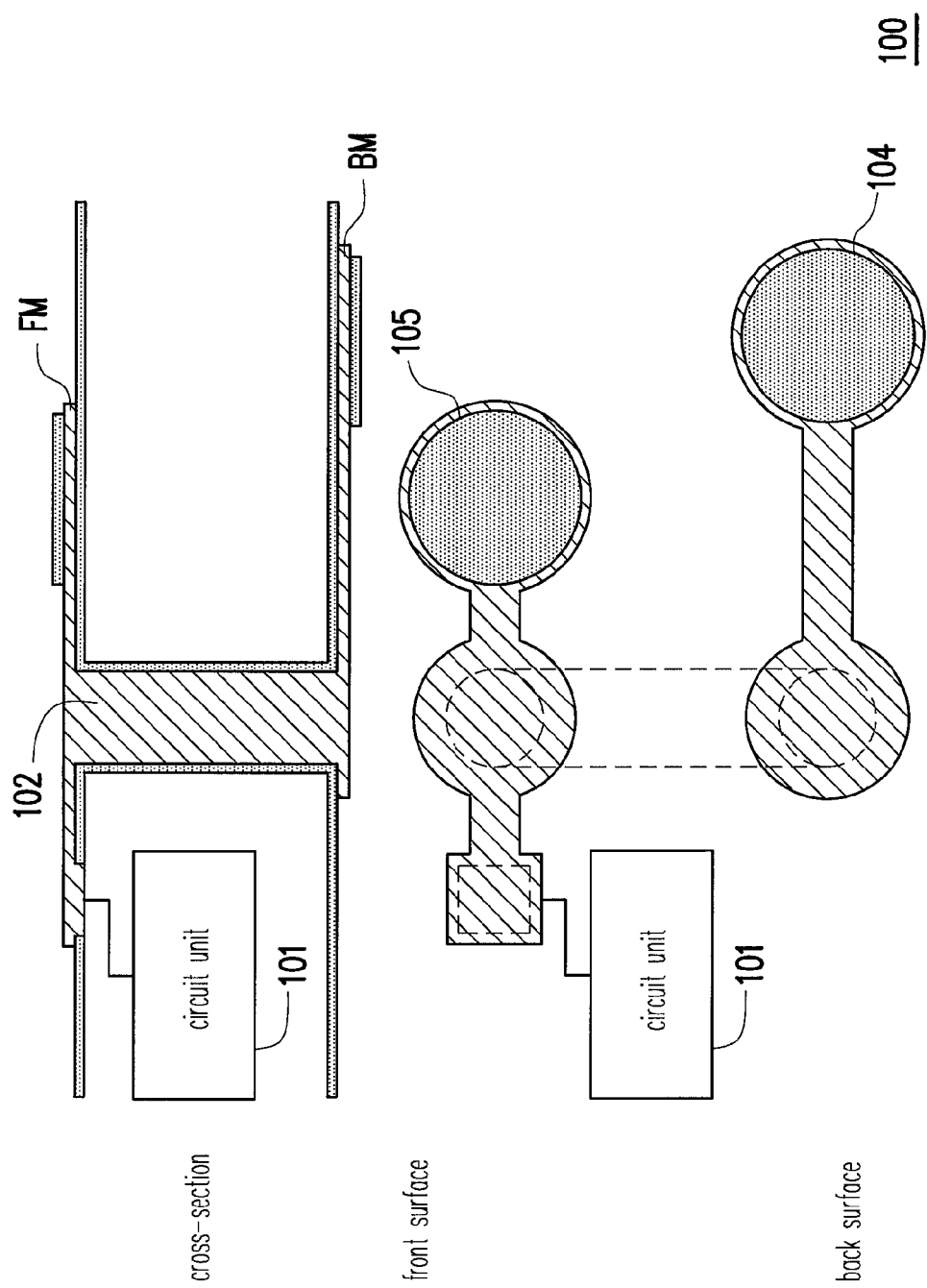
FIG. 1 is a schematic diagram illustrating a through silicon via (TSV) of a conventional wafer.
Figure 2:
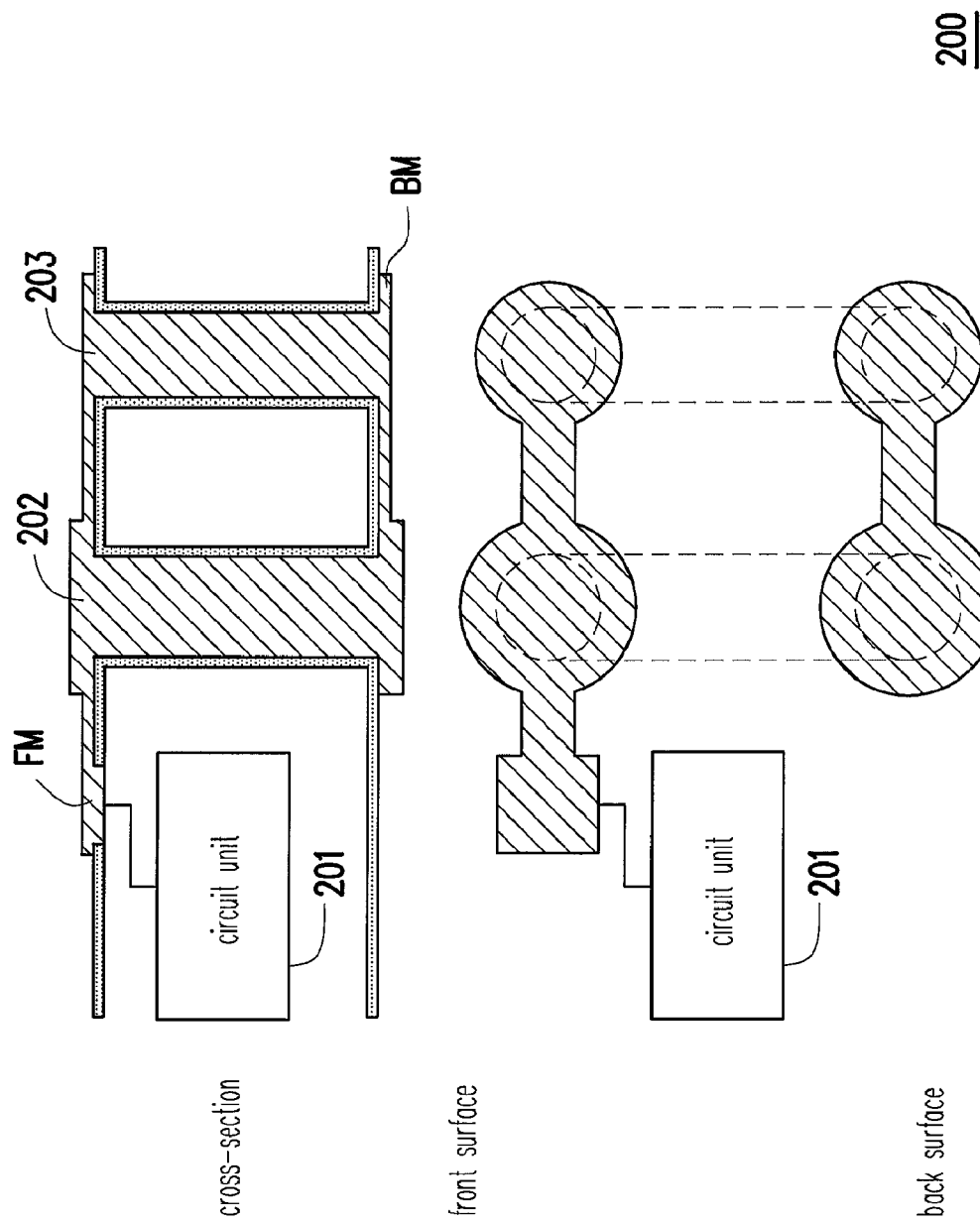
FIG. 2 is a schematic diagram illustrating a TSV of another conventional wafer with a spare TSV.

Descriptions of the present invention are given with reference to the embodiments illustrated with accompanied drawings wherein same or similar parts are denoted with same reference numerals.

Figure 3:
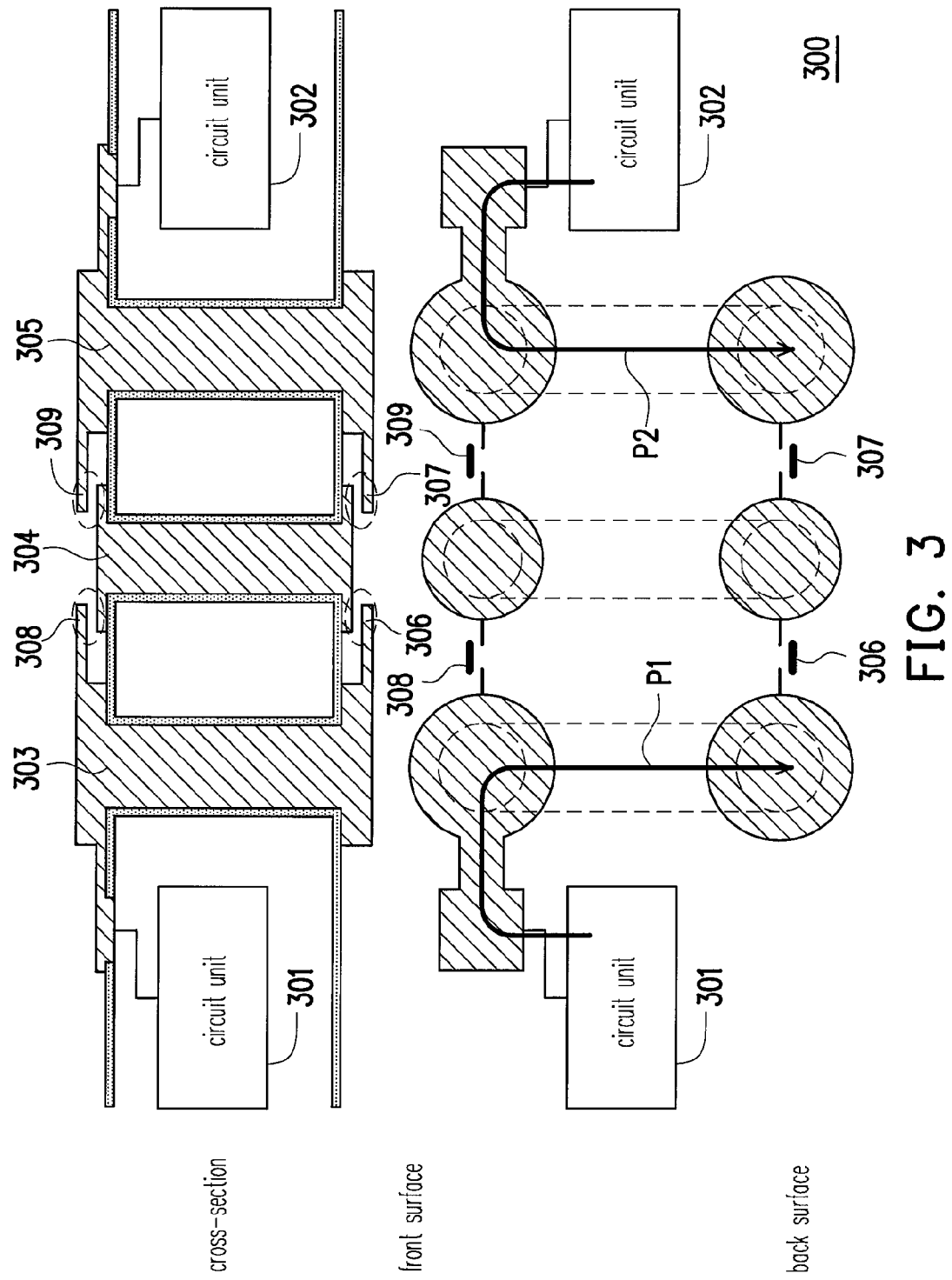
FIG. 3 depicts a schematic view of a wafer according to an exemplary embodiment.

FIG. 3 depicts a schematic view of a wafer according to an embodiment. Referring to FIG. 3, a wafer 300 includes circuit units 301 and 302, through silicon vias (TSVs) 303 and 305, a spare TSV 304, and anti-fuses 306~309. Here, the circuit units 301 and 302 are disposed inside the wafer 300. The TSV 303 passes through the wafer 300 vertically and is coupled to the circuit unit 301 via a front metal of the wafer 300. The TSV 305 passes through the wafer 300 vertically and is coupled to the circuit unit 302 via the front metal of the wafer 300. Hence, the circuit units 301 and 302 are capable of transmitting signals with circuit units (not shown) inside wafers of upper and lower layers via the TSVs 303 and 305 respectively. The spare TSV 304 passes through the wafer 300 vertically and is used to replace the failed TSV 303 or 305 when the TSV 303 or 305 has failed.

In the present exemplary embodiment, on a front surface of the wafer 300, the spare TSV 304 and the TSVs 303 and 305 respectively include the anti-fuses 308 and 309 therebetween. In addition, on a back surface of the wafer 300, the spare TSV 304 and the TSVs 303 and 305 respectively include the anti-fuses 306 and 307 therebetween. The anti-fuses 306~309 are metal-to-metal anti-fuses (but are not limited thereto), that is, an amorphous silicon material, for example, is doped between two metal layers for implementation. The anti-fuses 306~309 are initially in an open state, and are permanently changed into a short circuit state when a voltage is applied to the two metal layers.

Figure 4:
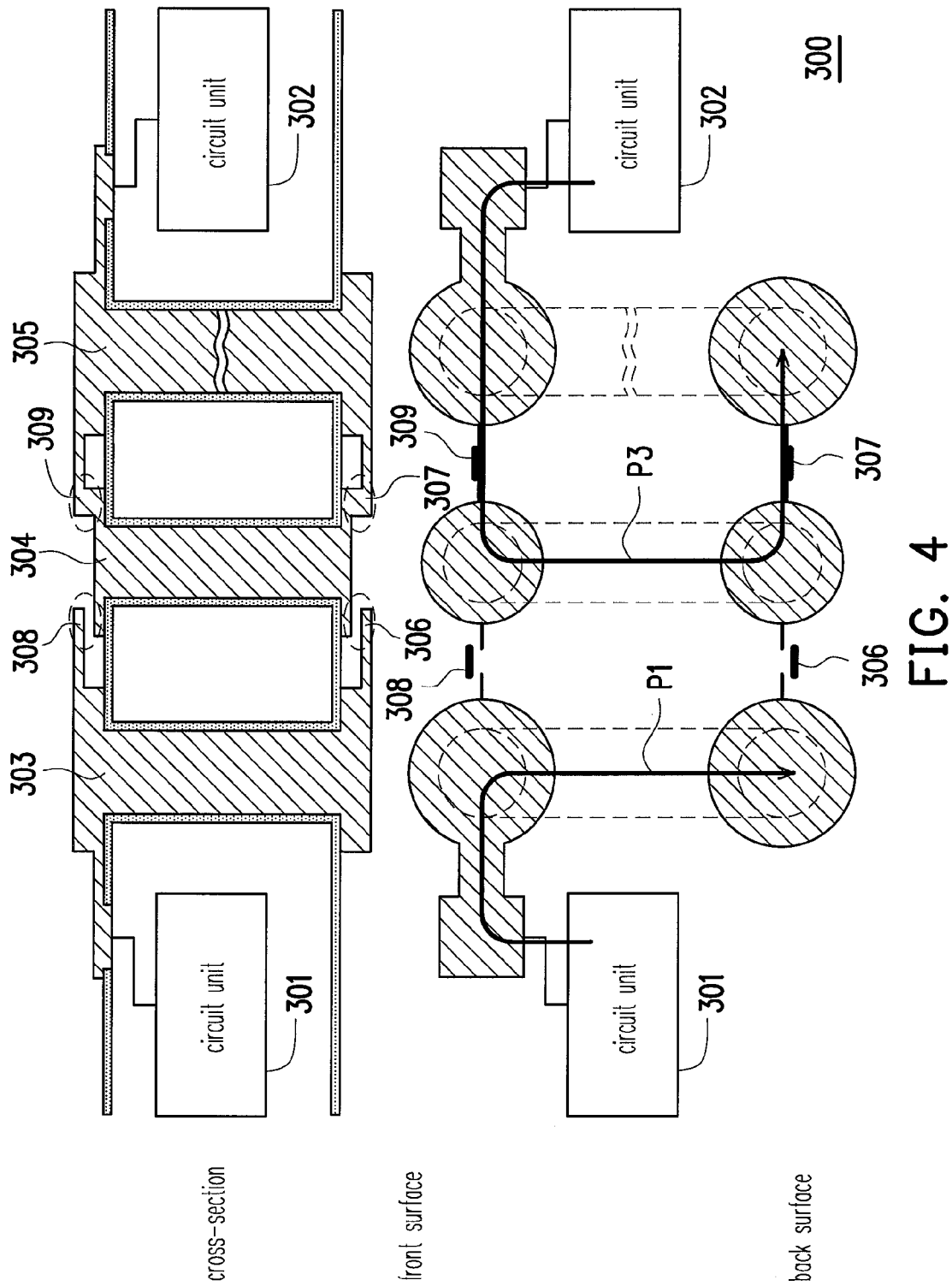
FIG. 4 illustrates an example of a common spare TSV according to an exemplary embodiment.

FIG. 4 illustrates an example of a common spare TSV 304 according to an embodiment. Referring to FIG. 3 and FIG. 4 simultaneously, after the wafer 300 has been manufactured and tested to ensure both the TSVs 303 and 305 have not failed, the anti-fuses 306~309 then remain in the open state so that the spare TSV 304 is not utilized. Hence, the circuit units 301 and 302 are capable of transmitting signals with circuit units inside the wafers of the upper and lower layers via the TSVs 303 and 305 respectively as the arrowhead paths P1 and P2.

However, after the wafer 300 has been manufactured and tested to find the failure of the TSV 305, then a voltage is respectively applied to the two metal layers of the anti-fuses 307 and 309 in the present exemplary embodiment, so that the anti-fuses 307 and 309 are changed from the original on-state to the short circuit state. As a result, the spare TSV 304 replaces the failed TSV 305, and the circuit units 301 and 302 are still capable of transmitting signals with the circuit units inside the wafers of the upper and lower layers respectively via the TSV 303 and the spare TSV 304 as the arrowhead paths P1 and P3.

Figure 5:
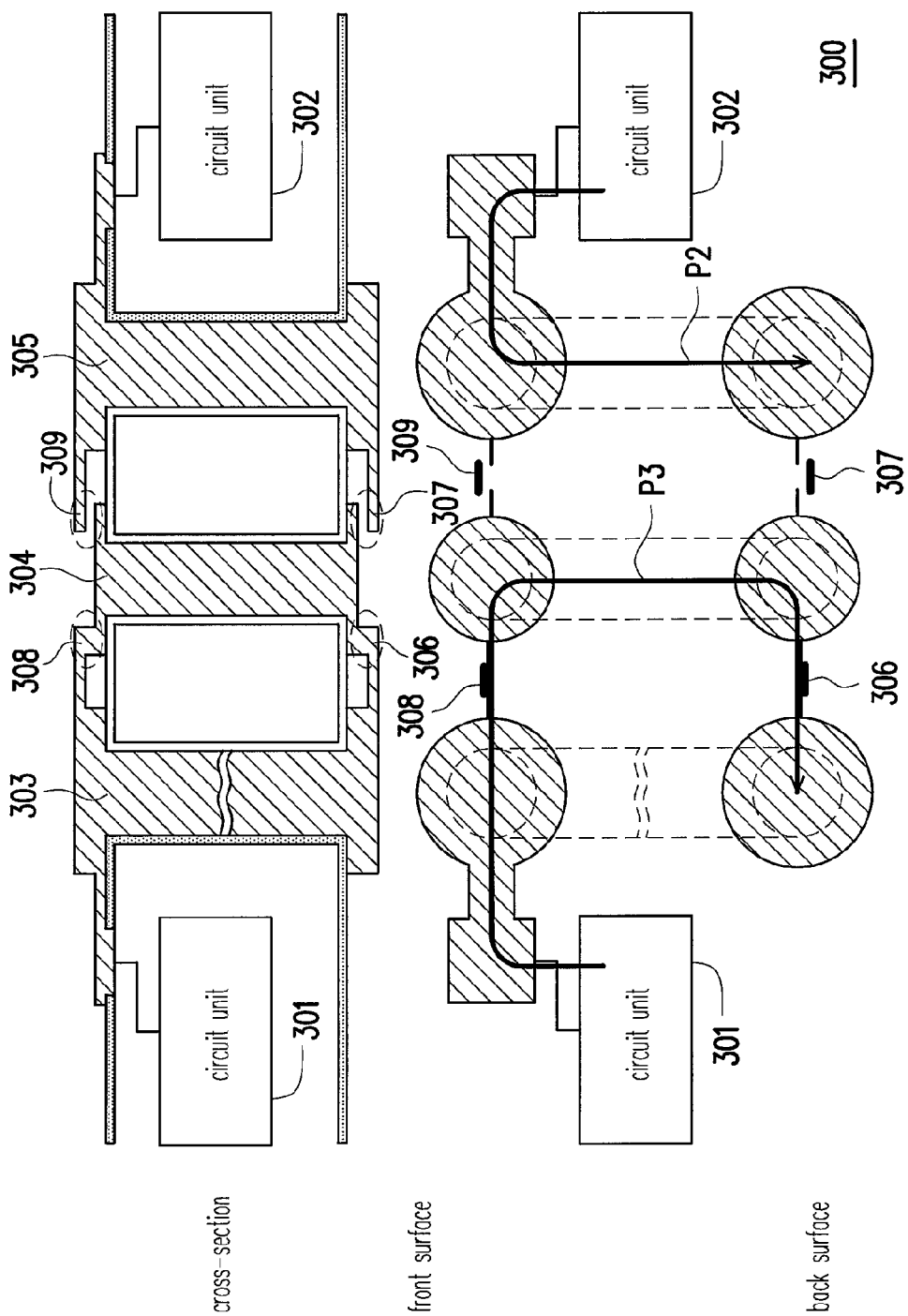
FIG. 5 illustrates an example of a common spare TSV according to another exemplary embodiment.

Moreover, FIG. 5 illustrates an example of a common spare TSV 304 according to another embodiment. Referring to FIG. 3 and FIG. 5 simultaneously, after the wafer 300 has been manufactured and tested to find the failure of the TSV 303, a voltage is then respectively applied to the two metal layers of the anti-fuses 306 and 308 in the present exemplary embodiment, so that the anti-fuses 306 and 308 are changed from the original on-state to the short circuit state. Consequently, the spare TSV 304 replaces the failed TSV 303, and the circuit units 301 and 302 are still capable of transmitting signals with the circuit units inside the wafers of the upper and lower layers respectively via the TSV 304 and the spare TSV 305 as the arrowhead paths P3 and P2.

Figure 6:
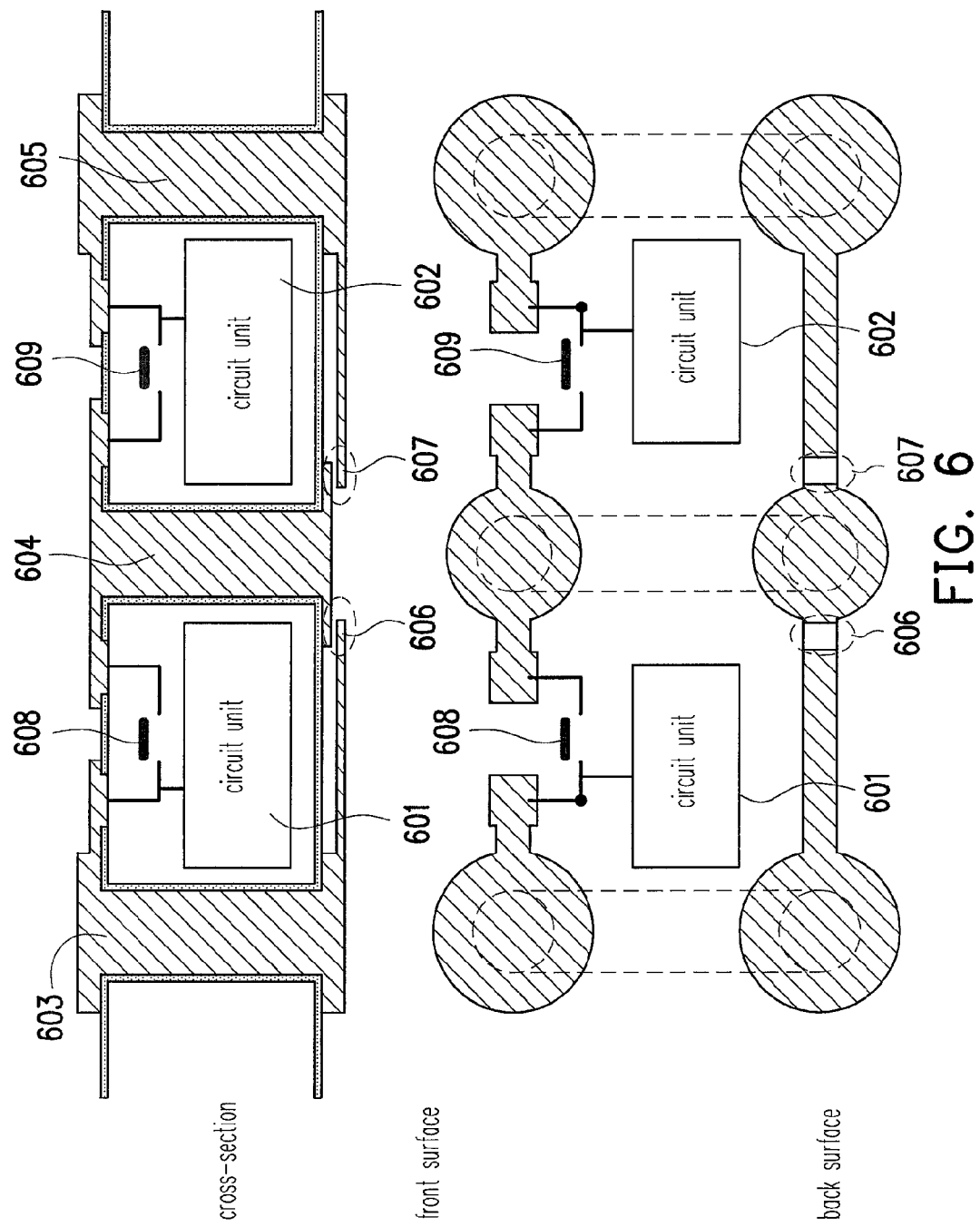
FIG. 6 depicts a schematic view of a wafer according to another exemplary embodiment.

FIG. 6 depicts a schematic view of a wafer according to another exemplary embodiment. Referring to FIG. 6, a wafer 600 includes circuit units 601 and 602, TSVs 603 and 605, a spare TSV 604, anti-fuses 606 and 607, and switching units 608 and 609. Here, the circuit units 601 and 602 are disposed inside the wafer 600. The TSV 603 passes through the wafer 600 vertically and is coupled to the circuit unit 601 via the front metal of the wafer 600. The TSV 605 passes through the wafer 600 vertically and is coupled to the circuit unit 602 via a front metal of the wafer 600. Hence, the circuit units 601 and 602 are capable of transmitting signals with circuit units (not shown) inside wafers of upper and lower layers via the TSVs 603 and 605 respectively. The spare TSV 604 passes through the wafer 600 vertically, and is used to replace the failed TSV 603 or 605 when the TSV 603 or 605 has failed.

The switching unit 608 is disposed inside the wafer 600, coupled to the circuit unit 601, and coupled to the TSV 603 and the spare TSV 604 respectively via the front metal of the wafer 600. The switching unit 609 is disposed inside the wafer 600, coupled to the circuit unit 602, and coupled to the TSV 605 and the spare TSV 604 respectively via the front metal of the wafer 600. Here, the switching units 608 and 609 are implemented with a one-time programmable (OTP) element, for example, but are not limited thereto.

In the present exemplary embodiment, on a back surface of the wafer 600, the spare TSV 604 and the TSVs 603 and 605 respectively include the anti-fuses 606 and 607 therebetween. The anti-fuses 606 and 607 are metal-to-metal anti-fuses (but are not limited thereto). That is, an amorphous silicon material, for example, is doped between two metal layers for implementation. The anti-fuses 606 and 607 are initially in an open state, and are permanently changed into a short circuit state when a voltage is applied to the two metal layers.

In the present exemplary embodiment, after the wafer 600 has been manufactured and examined to ensure both the TSVs 603 and 605 have not failed, the switching units 608 and 609 and the anti-fuses 606 and 607 then remain in the open state so that the spare TSV 604 is not utilized. Hence, the circuit units 601 and 602 are capable of transmitting signals with the circuit units inside the wafers of the upper and lower layers via the TSVs 603 and 605 respectively.

However, after the wafer 600 has been manufactured and tested to find the failure of the TSV 605, a voltage is then respectively applied to the two metal layers of the anti-fuse 607 in the present exemplary embodiment, so that the anti-fuse 607 is changed from the original on-state to the short circuit state and the switching unit 609 is programmed to be conductive. As a result, the spare TSV 604 replaces the failed TSV 605, and the circuit units 601 and 602 are still capable of transmitting signals with the circuit units inside the wafers of the upper and lower layers respectively via the TSV 603 and the spare TSV 604.

However, after the wafer 600 has been manufactured and tested to find the failure of the TSV 603, then a voltage is respectively applied to the two metal layers of the anti-fuse 606 in the present exemplary embodiment, so that the anti-fuse 606 is changed from the original on-state to the short circuit state and the switching unit 608 is programmed to be conductive. Therefore, the spare TSV 604 replaces the failed TSV 603, and the circuit units 601 and 602 are still capable of transmitting signals with the circuit units inside the wafers of the upper and lower layers respectively via the spare TSV 604 and the TSV 605.

Figure 7:
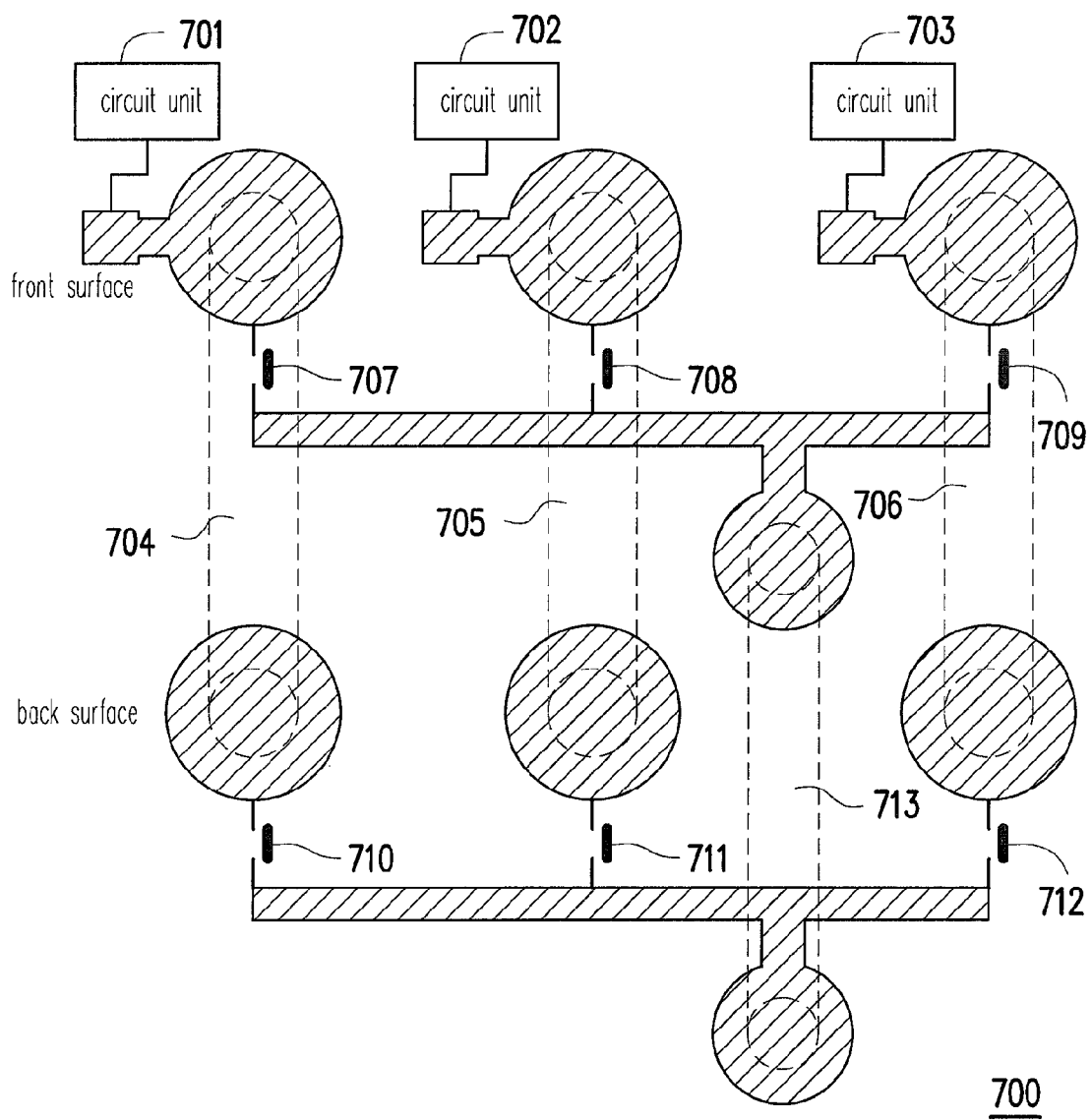
FIG. 7 depicts a schematic view of a wafer according to another exemplary embodiment.

FIG. 7 depicts a schematic view of a wafer according to an embodiment. Referring to FIG. 7, a wafer 700 includes circuit units 701~703, TSVs 704~706, anti-fuses 707~712, and a spare TSV 713. Here, the circuit units 701~703 are disposed inside the wafer 700. The TSV 704 passes through the wafer 700 vertically and is coupled to the circuit unit 701 via a front metal of the wafer 700. The TSV 705 passes through the wafer 700 vertically and is coupled to the circuit unit 702 via a front metal of the wafer 700. The TSV 706 passes through the wafer 700 vertically and is coupled to the circuit unit 703 via the front metal of the wafer 700. Hence, the circuit units 701~703 are capable of transmitting signals with circuit units (not shown) inside wafers of upper and lower layers via TSVs 704, 705, and 706 respectively. The spare TSV 713 passes through the wafer 700 and is used to replace the failed TSV 704, 705, or 706 when the TSV 704, 705, or 706 has failed.

In the present exemplary embodiment, the spare TSV 713 and the TSVs 704~706 respectively include the anti-fuses 707~709 therebetween. In addition, on a back surface of the wafer 700, the spare TSV 713 and the TSVs 704~706 respectively include the anti-fuses 710~712 therebetween. The anti-fuses 707~712 are metal-to-metal anti-fuses (but are not limited thereto). That is, an amorphous silicon material, for example, is doped between two metal layers for implementation. The anti-fuses 707~712 are initially in an open state, and are permanently changed into a short circuit state when a voltage is applied to the two metal layers.

In the present exemplary embodiment, after the wafer 700 has been manufactured and tested to ensure the TSVs 704~706 have not failed, the anti-fuses 707~712 remain in the open state so that the spare TSV 713 is not utilized. Hence, the circuit units 701~703 are capable of transmitting signals with circuit units inside the wafers of the upper and lower layers via the TSVs 704, 705, and 706 respectively.

Nevertheless, after the wafer 700 has been manufactured and tested to find the failure of the TSV 704, a voltage is respectively applied to the two metal layers of the anti-fuses 707 and 710 in the present exemplary embodiment, so that the anti-fuses 707 and 710 are changed from the original on-state to the short circuit state. Therefore, the spare TSV 713 replaces the failed TSV 704, and the circuit units 701~703 are still capable of transmitting signals with the circuit units inside the wafers of the upper and lower layers respectively via the spare TSV 713 and the TSVs 705 and 706.

Furthermore, after the wafer 700 has been manufactured and tested to find the failure of the TSV 705, a voltage is respectively applied to the two metal layers of the anti-fuses 708 and 711 in the present exemplary embodiment, so that the anti-fuses 708 and 711 are changed from the original on-state to the short circuit state. Therefore, the spare TSV 713 replaces the failed TSV 705, and the circuit units 701~703 are capable of transmitting signals with the circuit units inside the wafers of the upper and lower layers via the TSV 704, the spare TSV 713, and the TSV 706 respectively.

In addition, after the wafer 700 has been manufactured and tested to find the failure of the TSV 706, a voltage is respectively applied to the two metal layers of the anti-fuses 709 and 712 in the present exemplary embodiment, so that the anti-fuses 709 and 712 are changed from the original on-state to the short circuit state. Therefore, the spare TSV 713 replaces the failed TSV 706, and the circuit units 701~703 are capable of transmitting signals with the circuit units inside the wafers of the upper and lower layers via the TSVs 704 and 705 and the spare TSV 713 respectively.

In other exemplary embodiments, a one-time programmable (OTP) element, for instance, is manufactured inside the wafer 700 to replace the anti-fuses 707-709. These variations are also within the scope of the present exemplary embodiment.

In light of the foregoing, the wafers 300 and 600 both illustrate a spare TSV shared by TSVs coupled respectively to two circuit units. Moreover, the wafer 700 illustrates a spare TSV shared by TSVs coupled respectively to three circuit units. However, in other exemplary embodiments, a spare TSV is shared by TSVs coupled respectively to more than three circuit units. These variations are also within the scope of the present exemplary embodiment.

Figure 8:
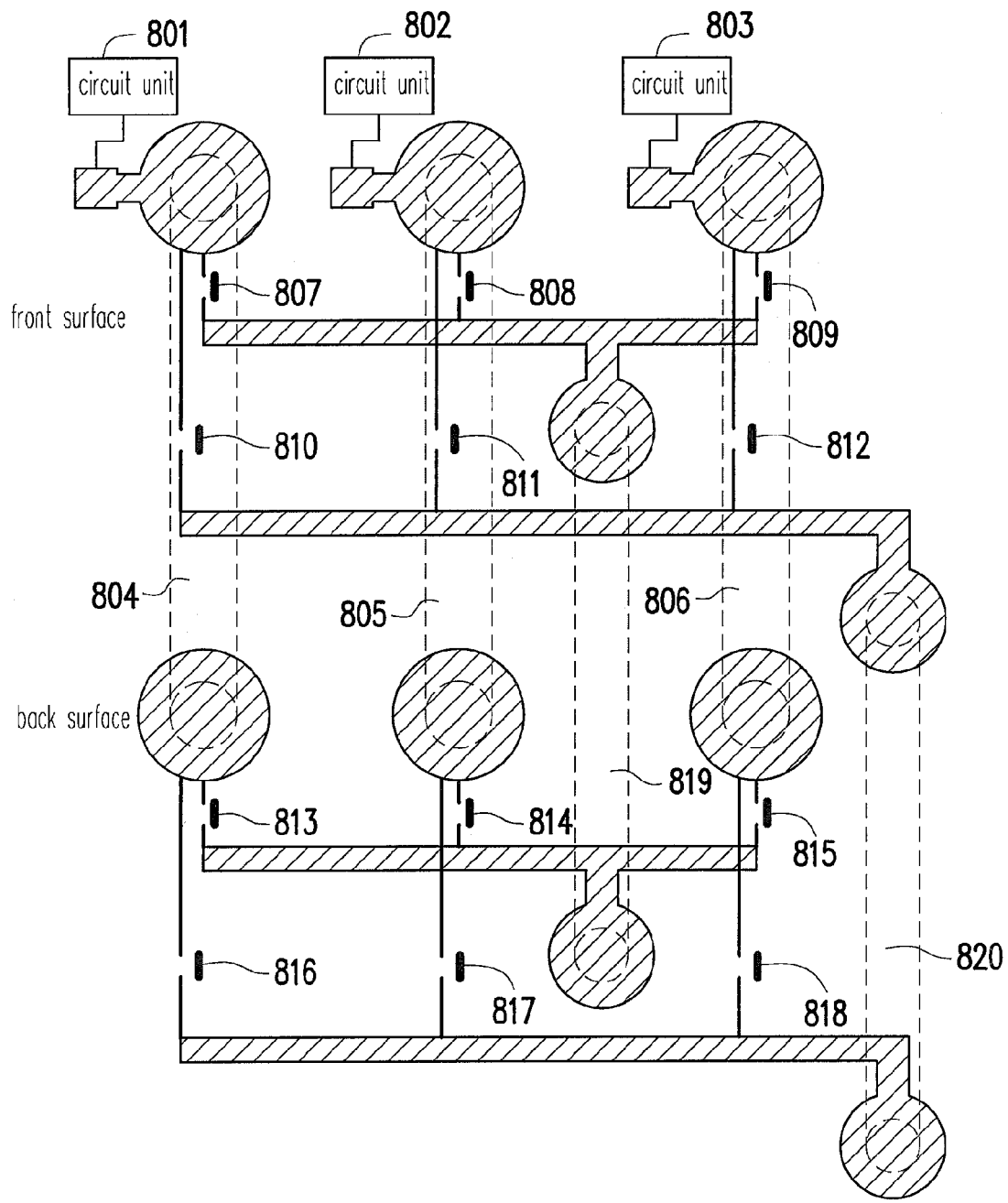
FIG. 8 depicts a schematic view of a wafer according to another exemplary embodiment.

FIG. 8 depicts a schematic view of a wafer according to an embodiment. Referring to FIG. 8, a wafer 800 includes circuit units 801~803, TSVs 804~806, anti-fuses 807~818, and spare TSVs 819 and 820. Here, the circuit units 801~803 are disposed inside the wafer 800. The TSV 804 passes through the wafer 800 vertically and is coupled to the circuit unit 801 via a front metal of the wafer 800. The TSV 805 passes through the wafer 800 vertically and is coupled to the circuit unit 802 via the front metal of the wafer 800. The TSV 806 passes through the wafer 800 vertically and is coupled to the circuit unit 803 via the front metal of the wafer 800. Hence, the circuit units 801~803 are capable of transmitting signals with circuit units (not shown) inside wafers of upper and lower layers via TSVs 804, 805, and 806 respectively. The spare TSVs 819 and 820 respectively run through the wafer 800 vertically. When two of the TSVs 804, 805, and 806 have failed, the spare TSVs 819 and 820 replace the two failed TSVs such as the TSVs 804 and 805, the TSVs 805 and 806, or the TSVs 806 and 804.

In the present exemplary embodiment, on a front surface of the wafer 800, the spare TSV 819 and the TSVs 804~806 respectively include the anti-fuses 807~809 therebetween. On a back surface of the wafer 800, the spare TSV 819 and the TSVs 804~806 respectively include the anti-fuses 813~815 therebetween. In addition, on the front surface of the wafer 800, the spare TSV 820 and the TSVs 804~806 respectively include the anti-fuses 810~812 therebetween. On the back surface of the wafer 800, the spare TSV 820 and the TSVs 804~806 respectively include anti-fuses 816~818 therebetween. The anti-fuses 807~818 are metal-to-metal anti-fuses (but are not limited thereto). That is, an amorphous silicon material, for example, is doped between two metal layers for implementation. The anti-fuses 807~818 are initially in an open state, and are permanently changed into a short circuit state when a voltage is applied to the two metal layers.

In the present exemplary embodiment, after the wafer 800 has been manufactured and tested to ensure the TSVs 804~806 have not failed, the anti-fuses 80~7818 remain in the open state so that the spare TSVs 819 and 820 are not utilized. Hence, the circuit units 801~803 are capable of transmitting signals with circuit units inside wafers of upper and lower layers via TSVs 804, 805, and 806 respectively.

Nevertheless, after the wafer 800 has been manufactured and tested to find the failure of the TSVs 804 and 805, a voltage is respectively applied to the two metal layers of the anti-fuses 807, 811, 813, and 817 in the present exemplary embodiment, so that the anti-fuses 807, 811, 813, and 817 are changed from the original on-state to the short circuit state. Consequently, the spare TSVs 819 and 820 replace the failed TSVs 804 and 805, so that the circuit units 801~803 are capable of transmitting signals with the circuit units inside the wafers of the upper and lower layers respectively via the spare TSVs 819 and 820 and the TSV 806.

Additionally, after the wafer 800 has been manufactured and tested to find the failure of the TSVs 805 and 806, a voltage is respectively applied to the two metal layers of the anti-fuses 808, 812, 814, and 818 in the present exemplary embodiment, so that the anti-fuses 808, 812, 814, and 818 are changed from the original on-state to the short circuit state. Consequently, the spare TSVs 819 and 820 replace the failed TSVs 805 and 806 respectively, so that the circuit units 801~803 are capable of transmitting signals with the circuit units inside the wafers of the upper and lower layers respectively via the TSV 804, the spare TSVs 819 and 820.

Moreover, after the wafer 800 has been manufactured and tested to find the failure of the TSVs 806 and 804, a voltage is respectively applied to the two metal layers of the anti-fuses 809, 810, 815, and 816 in the present exemplary embodiment, so that the anti-fuses 809, 810, 815, and 816 are changed from the original on-state to the short circuit state. Consequently, the spare TSVs 819 and 820 replace the failed TSVs 806 and 804 respectively, so that the circuit units 801~803 are capable of transmitting signals with the circuit units inside the wafers of the upper and lower layers respectively via the spare TSV 820, the TSV 805, and the spare TSV 819.

In other exemplary embodiments, an OTP element, for instance, is manufactured inside the wafer 800 to replace the anti-fuses 807~812. These variations are also within the scope of the present exemplary embodiment.

In light of the foregoing, the wafer 700 illustrates a spare TSV shared by TSVs coupled respectively to three circuit units, and the wafer 800 illustrates two spare TSVs shared by TSVs coupled respectively to three circuit units. However, in other exemplary embodiments, two spare TSVs are shared by TSVs coupled respectively to more than three circuit units. For instance, two spare TSVs are shared by TSVs coupled respectively to five circuit units. However, the present invention is not limited thereto, these variations are also within the scope of the present exemplary embodiment.

In the present exemplary embodiment, the circuit units 801~803 are disposed within a certain region inside the wafer 800. According to a wiring space of the circuit units 801~803 in this region, whether the spare TSVs 819 and 820 are simultaneously or independently disposed within this region is determined.

For example, when the circuit units 801~803 have sufficient wiring space in this region, the spare TSVs 819 and 820 are disposed within this region simultaneously, so that the spare TSVs 819 and 820 (i.e. wafer 800) are shared by TSVs coupled respectively to the circuit units 801~803. In addition, when the circuit units 801~803 have insufficient wiring space in this region, one of the spare TSVs 819 and 820 is disposed within this region, so that the spare TSV selected (i.e. wafer 700) is shared by TSVs coupled respectively to the circuit units 801~803.

Alternatively, in other exemplary embodiments, an N number of spare TSVs are shared by TSVs coupled respectively to an M number of circuit units (M and N are both positive integers, and M is greater than N). For instance, three spare TSVs are shared by TSVs coupled respectively to seven circuit units, or four spare TSVs are shared by TSVs coupled respectively to ten circuit units. However, the present exemplary embodiment is not limited thereto, and these variations are also within the scope of the present exemplary embodiment.

Figure 9:
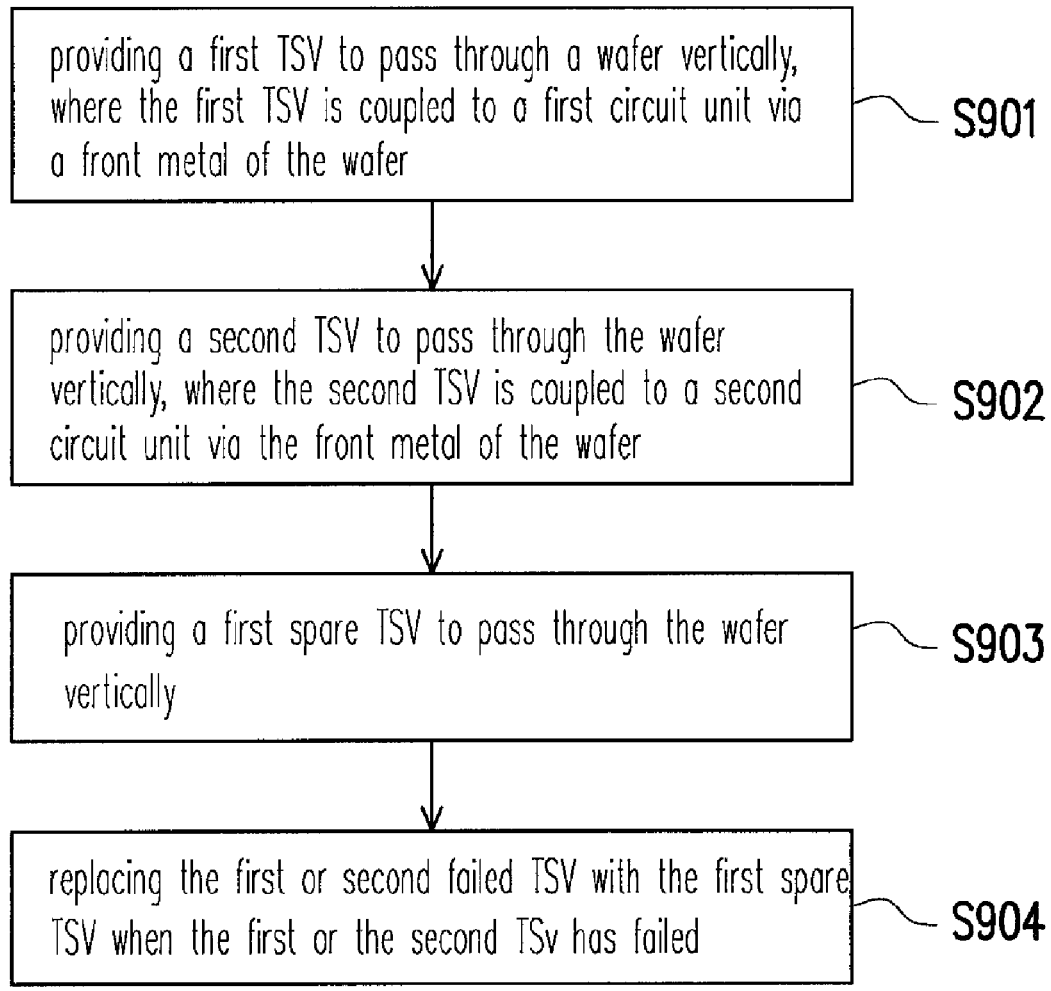
FIG. 9 is a flow chart of a method of improving a yield rate of a wafer according to an exemplary embodiment.

FIG. 9 is a flow chart of a method of improving a yield rate of a wafer according to an exemplary embodiment of the present invention. Referring to FIG. 9, generally, an inside of the wafer includes at least a first and a second circuit units. The method of improving the yield rate of the wafer includes the following. A first TSV is provided to pass through the wafer vertically and the first TSV is coupled to a first circuit unit via a front metal of the wafer (step S901). Next, a second TSV is provided to pass through the wafer vertically, where the second TSV is coupled to a second circuit unit via the front metal of the wafer (step S902). Thereafter, a first spare TSV is provided to pass through the wafer vertically (step S903). Finally, when the first or the second TSV fails, the first spare TSV is adopted to replace the failed first or second TSV (step S904).

In the present exemplary embodiment, the method of improving the yield rate of the wafer further includes the following. Anti-fuses are disposed between the first spare TSV and the first and the second TSVs respectively on a front surface of the wafer. Moreover, the anti-fuses are disposed between the first spare TSV and the first and the second TSVs respectively on a back surface of the wafer.

In other exemplary embodiments, the method of improving the yield rate of the wafer further includes the following. A first switching unit is disposed inside the wafer to couple with the first circuit unit. The first switching unit is coupled to the first TSV and the first spare TSV via the front metal of the wafer. A second switching unit is disposed within the wafer to couple with the second circuit unit. The second switching unit is respectively coupled to the first TSV and the first spare TSV via the front metal of the wafer. Afterward, the anti-fuses are disposed between the first spare TSV and the first and the second TSVs respectively.

In other exemplary embodiments, the inside of the wafer further includes a third circuit unit. The method of improving the yield rate of the wafer further includes the following. A third TSV is provided to pass through the wafer vertically. Here, the third TSV is coupled to the third circuit unit via the front metal of the wafer. On the front surface of the wafer, the anti-fuses are disposed between the first spare TSV and the first, the second, and the third TSVs respectively. On the back surface of the wafer, the anti-fuses are disposed between the first spare TSV and the first, the second, and the third TSVs respectively. Hence, when one of the first, the second, and the third TSV has failed, the first spare TSV further replaces the failed first, second, or third TSV.

In other exemplary embodiments, when the inside of the wafer further includes the third circuit unit, the method of enhancing the yield rate of the wafer further includes the following. A second spare TSV is provided to pass through the wafer vertically. On the front surface of the wafer, the anti-fuses are disposed between the second spare TSV and the first, the second, and the third TSVs respectively. On the back surface of the wafer, the anti-fuses are disposed between the second spare TSV and the first, the second, and the third TSVs respectively. Hence, when two of the first, the second, and the third TSVs have failed, the first spare TSV and the second spare TSV respectively replace the two failed TSVs. It should be noted that the TSVs of the present exemplary embodiment are not limited to pass through the wafer vertically.

In other exemplary embodiments, when the first, the second, and the third circuit units are all disposed in a certain region inside the wafer, the method of improving the yield rate of the wafer further include the following. According to a wiring space of the first, the second, and the third circuit units within this region, whether the first and the second spare TSVs are disposed within this region simultaneously or independently is determined.

In summary, in the exemplary embodiments aforementioned, at least one spare TSV is shared by TSVs coupled respectively to a plurality of circuit units inside the wafer. As a result, after the wafer has been manufactured and tested to find the failure of the TSV, the spare TSV is adopted to replace the failed TSV. Hence, the yield rate of the wafer is greatly enhanced. Furthermore, since at least one spare TSV is shared by the TSVs coupled respectively to the circuit units inside the wafer, an obvious increase in wafer area is avoided.

Alternatively, each exemplary embodiment aforementioned illustrates the technique of manufacturing the anti-fuses on the back surface of the wafer, where the technique can be applied in corporation with the TSV technique. However, the anti-fuses manufactured on the back surface of the wafer are not limited to corporate with the TSV technique. In other words, relevant application of manufacturing the anti-fuses on the back surface of the wafer are all within the scope of the present exemplary embodiment.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A wafer, comprising:
a first circuit unit and a second circuit unit, disposed inside the wafer;
a first through silicon via (TSV), passing through the wafer and coupled to the first circuit unit via a front metal of the wafer;
a second TSV, passing through the wafer and coupled to the second circuit unit via the front metal of the wafer; and
a first spare TSV, passing through the wafer to replace the failed first or second TSV when the first TSV or the second TSV has failed,
wherein on a back surface of the wafer, the first spare TSV and the first and second TSVs respectively comprise an anti-fuse therebetween.

2. The wafer as claimed in claim 1, further comprising:
a first switching unit, disposed inside the wafer, coupled to the first circuit unit, and coupled to the first TSV and the first spare TSV respectively via the front metal of the wafer; and
a second switching unit, disposed inside the wafer, coupled to the second circuit unit, and coupled to the second TSV and the first spare TSV respectively via the front metal of the wafer.

3. The wafer as claimed in claim 2, wherein the anti-fuse is a metal-to-metal anti-fuse, and the first switching unit and the second switching unit respectively comprise a one-time programmable element.

4. The wafer as claimed in claim 1, wherein on a front surface of the wafer, the first spare TSV and the first and second TSVs respectively comprise the anti-fuse therebetween.

5. The wafer as claimed in claim 4, wherein the anti-fuse is a metal-to-metal anti-fuse.

6. The wafer as claimed in claim 5, further comprising:
a third circuit unit, disposed inside the wafer; and
a third TSV, passing through the wafer and coupled to the third circuit unit via the front metal of the wafer,
wherein on the front surface of the wafer, the first spare TSV and the third TSV further comprise the anti-fuse therebetween, and
on the back surface of the wafer, the first spare TSV and the third TSV further comprise the anti-fuse therebetween.

7. The wafer as claimed in claim 6, wherein the first spare TSV further replaces the failed TSV when one of the first TSV, the second TSV, and the third TSV has failed.

8. The wafer as claimed in claim 6, further comprising:
a second spare TSV, passing through the wafer,
wherein on the front surface of the wafer, the second spare TSV and the first and the second TSVs further respectively comprise the anti-fuse therebetween, and
on the back surface of the wafer, the second spare TSV and the first and the second TSVs further respectively comprise the anti-fuse therebetween.

9. The wafer as claimed in claim 8, wherein when at least two of the first TSV, the second TSV, and the third TSV have failed, the first spare TSV, together with the second spare TSV, further replace the failed TSVs respectively.

10. The wafer as claimed in claim 8, wherein the first circuit unit, the second circuit unit, and the third circuit unit are disposed on a region inside the wafer, and whether the first spare TSV and the second spare TSV are disposed within the region simultaneously or independently is determined according to a wiring space of the first circuit unit, the second circuit unit, and the third circuit unit within the region.

11. A method of improving a yield rate of a wafer, an inside of the wafer comprising a first circuit unit and a second circuit unit, and the method comprising:
providing a first TSV to pass through the wafer, wherein the first TSV is coupled to the first circuit unit via a front metal of the wafer;
providing a second TSV to pass through the wafer, wherein the second TSV is coupled to the second circuit unit via the front metal of the wafer;
providing a first spare TSV to pass through the wafer;
when the first TSV or the second TSV has failed, replacing the failed first TSV or second TSV with the first spare TSV; and
disposing an anti-fuse between the first spare TSV and the first TSV and the second TSV respectively on a back surface of the wafer.

12. The method of improving the yield rate of the wafer as claimed in claim 11, further comprising:
disposing the anti-fuse between the first spare TSV and the first TSV and the second TSV respectively on a front surface of the wafer.

13. The method of improving the yield rate of the wafer as claimed in claim 11, further comprising:
disposing a first switching unit inside the wafer to couple to the first circuit unit and coupling to the first TSV and the first spare TSV respectively via the front metal of the wafer; and
disposing a second switching unit inside the wafer to couple to the second circuit unit and coupling to the first TSV and the first spare TSV respectively via the front metal of the wafer.

14. The method of improving the yield rate of the wafer as claimed in claim 11, wherein the inside of the wafer further comprises a third circuit unit, and the method further comprises:
providing a third TSV to pass through the wafer, wherein the third TSV is coupled to the third circuit unit via the front metal of the wafer;
disposing the anti-fuse between the first spare TSV and the first TSV, the second TSV, and the third TSV respectively on a front surface of the wafer; and
disposing the anti-fuse between the first spare TSV and the third TSV on the back surface of the wafer.

15. The method of improving the yield rate of the wafer as claimed in claim 14, wherein when one of the first TSV, the second TSV, and the third TSV has failed, the first spare TSV further replaces the failed TSV.

16. The method of improving the yield rate of the wafer as claimed in claim 14, further comprising:
  providing a second spare TSV to pass through the wafer;
  disposing the anti-fuse between the second spare TSV and the first TSV, the second TSV, and the third TSV respectively on the front surface of the wafer; and
  disposing the anti-fuse between the second spare TSV and the first TSV, the second TSV, and the third TSV respectively on the back surface of the wafer.

17. The method of improving the yield rate of the wafer as claimed in claim 16, wherein when at least two of the first TSV, the second TSV, and the third TSV have failed, the first spare TSV, together with the second spare TSV, further replace the failed TSVs respectively.

18. The method of improving the yield rate of the wafer as claimed in claim 16, wherein the first circuit unit, the second circuit unit, and the third circuit unit are disposed on a region inside the wafer, and the method further comprises:
  determining whether the first spare TSV and the second spare TSV are disposed within the region simultaneously or independently according to a wiring space of the first circuit unit, the second circuit unit, and the third circuit unit within the region.

* * * * *